United States Patent [19]

Hosemann

[11] Patent Number: 4,613,807
[45] Date of Patent: Sep. 23, 1986

[54] LOW-NOISE SYSTEM FOR MEASURING FREQUENCY IN MULTIPHASE POWER TRANSMISSION SYSTEMS

[75] Inventor: Gerhard Hosemann, Rathsberg, Fed. Rep. of Germany

[73] Assignee: Siemens Aktiengesellschaft, Munich, Fed. Rep. of Germany

[21] Appl. No.: 571,457

[22] Filed: Jan. 17, 1984

[30] Foreign Application Priority Data

Feb. 2, 1983 [DE] Fed. Rep. of Germany ....... 3303454

[51] Int. Cl.$^4$ ............................................. G01R 23/02
[52] U.S. Cl. ................................. 318/807; 324/78 R; 324/78 D; 324/78 S
[58] Field of Search ........................ 318/803, 807, 808; 324/158 MG, 78 R, 78 O, 78 F, 78 J, 86; 364/484

[56] References Cited

U.S. PATENT DOCUMENTS 4,028,600 6/1977 Blaschke .............................. 318/810
4,475,074 10/1984 Reng ..................................... 318/809

*Primary Examiner*—David Smith, Jr.
*Attorney, Agent, or Firm*—Kenyon & Kenyon

[57] ABSTRACT

A system for measuring frequency in a multiphase line system for the transmission of electrical power. The power balance of a multiphase electric transmission line is monitored by forming the stationary orthogonal components of a measured value system taken directly from the line. A control element which is derived from a controlled frequency variable forms AC variables having a frequency which is proportional to the controlled variable. The variables are conducted to a transformation circuit from which are derived the orthogonal components. The transformation circuit provides a quantity which determines the direction of a space vector, which quantity is provided as an actual value to a controller which is also responsive to a constant reference value. The output of the controller is conducted as a frequency-proportional controlled variable to the control element for forming the AC variables used in the transformation. Additionally, the controller output is conducted to an output line as the measured frequency variable. Analog and digital arrangements are described for performing the frequency measurement.

8 Claims, 2 Drawing Figures 4,613,807

LOW-NOISE SYSTEM FOR MEASURING FREQUENCY IN MULTIPHASE POWER TRANSMISSION SYSTEMS

BACKGROUND OF THE INVENTION

This invention relates generally to frequency measurement systems, and more particularly, to a low-noise system for measuring the frequency in a multiphase electric power transmission system.

A frequency measurement is often required to determine whether the output power of a turbine agrees with the consumer power. With such a measurement, the electromechanical transients and the power balance in the transmission of electric power, illustratively from the turbines of a power generating station to an electric supply network, can be determined. In turbine power generation systems, the frequency is primarily related to the speed of rotation of the driving engine. However, such a speed can be determined directly only in the power generation station itself. Depending upon the type and load status of the consumers, electromagnetic transients occur between the power generating station and the supply network, which transients cause shifts in the phase and frequency of the voltages and currents in the transmission line. Such phase shifts result in incorrect frequency measurements.

The number of phases in an electromagnetic transmission system is only of secondary importance in determining the power balance of the transmission system, and it changes. A low-noise frequency measurement cannot be performed on a single phase and by measurement of a single AC quantity alone, such as through measurement of the time spacing between the zero crossings. Present in the transmission lines, depending upon the type and status of the consumers, are harmonics and subharmonics which shift the zero crossings. It is therefore necessary that the frequency or phase noise occurring in such transmission lines be removed, such as by filtering. In addition, asymmetrical conditions in the network, including asymmetrical short circuits and line interruptions produce difficulties in performing reliable frequency measurements. In such situations, the voltages which are desired to be monitored must be selected, illustratively from a total of six available conductor and conductor-to-ground voltages, in a three-phase voltage system.

It is, therefore, an object of this invention to provide a system which determines and measures, in an electric power transmission system, a quantity available outside of the power generating station corresponding as accurately as possible to the speed of rotation of the driving engine. It is a further object of this invention to provide a frequency measurement system which is not adversely affected by electromagnetic influences, such as subharmonics and harmonics, network faults, and other undesirable influences resulting from the type and status of the consumer.

It is also an object of this invention to provide a system wherein frequency and phase noise can be suppressed by suitable measuring devices, so as to facilitate recognition of critical states of the electromechanical transmission system.

SUMMARY OF THE INVENTION

The foregoing and other objects are achieved by this invention which is premised upon the understanding that the frequency of the corotating ("positive-sequence") component of a three-phase system is particularly well suited to serve as a quantity which corresponds accurately to the speed of rotation of the driving engine of a turbine generator. The time average of this quantity is free of all of the above-mentioned interference quantities, and therefore this quantity best characterizes the electromechanical state of the power transmission from the power generating station to the consumer. In accordance with the invention, the frequency measurement of a multiphase electric power transmission system is oriented toward the symmetrical component, thereby obviating the need for a further selection between the conductor and conductor-to-ground voltages. The problem is thus reduced to the separation of the fundamental of the in-phase component from the subharmonic and harmonic waves, and to measure its rotation. The separation of such frequency components can be achieved with bandpass filters, but such filters operate only imperfectly and with delay.

An apparatus for smoothing vector component voltages with correct phase is known from U.S. Pat. No. 3,824,437. In this known system, two voltages $|E| \cos \epsilon$, $|E| \sin \epsilon$ which are orthogonal components of a vector in a stationary orthogonal reference system, are converted in a vector rotator by multiplication with two voltages which are received as orthogonal components $\cos \alpha$, $\sin \alpha$ of a normalized vector (transformation vector). This results in corresponding orthogonal components $|E| \cos (\epsilon - \alpha)$, $|E| \sin (\epsilon - \alpha)$ of the input vector in a reference system which rotates with the transformation vector in a rigid phase relationship. The real component $|E| \cos (\epsilon - \alpha)$ of this transformed vector is entered as the desired value into a PI-controller, the output signal of which is integrated, and fed back to the PI-controller as the actual value. As the controlled deviation between the input vector and the transformation vector approaches zero, such that $\epsilon - \alpha = 0$, the real component corresponds to the averaged magnitude of the vector. However, such a mean value is not taken in the stationary orthogonal reference system, but in the reference system which rotates with the transformation vector in rigid phase relationship.

The imaginary component of the transformed vector is formed by dividing the real component corresponding to the quantity $\tan (\epsilon - \alpha)$, which is conducted to a further PI-controller. The output signal of this PI-controller is conducted as a frequency-proportional control voltage $\dot{\alpha}$ to a sine and cosine generator to produce output signals $\cos \alpha$ and $\sin \alpha$, which are conducted as the corresponding orthogonal stationary components of the transformation vector to an angle signal input of the above-mentioned vector rotator. The second PI-controller therefore regulates the directional deviation $(\epsilon - \alpha)$ by changing the frequency of the transformation vector until it rotates in an average synchronously with the set-in vector. In the steady-state situation, the transformation vector therefore always reproduces the direction of the set-in vector without a phase shift, and the superimposed harmonics and subharmonics of the vector are averaged. Subsequently, the orthogonal components of the filtered vector are formed by multiplication of the components of the transformation vector by the mean magnitude of the vector.

In accordance with the invention, a procedure similar to that described hereinabove can be followed for measuring the frequency in a multiphase line system for the transmission of electric power. The procedure is initiated by utilizing the orthogonal components of a measured value system which does not have a neutral point, and which is formed by the measurement values taken from the line system. The terms "orthogonal component," "in-phase component," and "space vector" are selected here in accordance with DIN 13 321. Measured scalar values $g_R$, $g_S$, and $g_T$ are selected for the conductor-to-ground voltages, or other electrical measurement quantities in the line system. Measured scalar values $g_{SR}$, $g_{TR}$, and $g_{ST}$ are selected for the corresponding linked quantities. Additionally, if a transformation quantity $a = \exp(j\, 2\pi/3)$ is designated, the real and imaginary components of which are set as the corresponding voltages into a coordinate transformer, then the in-phase component $g_1$ is defined in the customary power-varient notation, by the relations:

$$3g_1 = g_R + \underline{a}\, g_S + \underline{a}^2 g_T = \underline{a}\, g_{SR} + \underline{a}^2 g_{TR}$$

$$g_1 = \underbrace{-\tfrac{1}{6}(g_{SR} + g_{TR})}_{\dfrac{g_\alpha}{\sqrt{6}}} + \underbrace{j\dfrac{1}{2\sqrt{3}}(g_{SR} - g_{TR})}_{\dfrac{g_\beta}{\sqrt{6}}}$$

where the "orthogonal components" (power-invarient form) are given by $g_\alpha$ and $g_\beta$. These orthogonal components permit, in a stationary view, the representation of a measured value system which does not have a neutral point completely by the real component and the imaginary component of a complex number, relative to a non-rotating reference-axis. In this disclosure, a measured value system which does not have a neutral point shall be referred to as "neutral point-less," and is understood to mean a system in which the "null component," i.e., the sum of all measured scalar values, is equal to zero, as is the case, for example, for the linked conductor voltages. A measured value system with a neutral point is thus represented as the superposition of a null component with the neutral point less system. In the presentation of the in-phase component defined by the relationships given herein, the absence of a null point is assured as a result of the mathematical relation $1 + a + a^2 = 0$. Such coordinate transformers which furnish the orthogonal components $g_\alpha$ and $g_\beta$, in accordance with the above relationships, are known.

In accordance with the mentioned standard, the space vector $g_s$ is defined by the complex relation:

$$g_s = \dfrac{g_\alpha + jg_\beta}{\sqrt{2}} \cdot \exp(-j\omega t)$$

$$= \dfrac{1}{\sqrt{3}}\,[(g_\alpha \cos\omega t + g_\beta \sin\omega t) + j(-g_\alpha \sin\omega t + g_\beta \cos\omega t)]$$

This expression corresponds to a transformation of the orthogonal components found in the stationary non-rotating presentation into frequency-transformed components in which a quantity which is variable with frequency $\omega t$ is now transformed (demodulated) into a constant quantity. This transformation, expressed as $\exp(-j\omega t)$, corresponds to a transformation matrix, the elements of which are expressed as $\cos\omega t$ and $\sin\omega t$.

When applied to the orthogonal components, the foregoing transformation produces the space vector. In accordance with a method aspect of the invention, two AC quantities which vary with a frequency which is proportional to the controlled quantity, are formed from an internally formed controlled quantity as elements of a corresponding transformation matrix. Thus, is formed a direction-determining quantity of the space vector associated with the orthogonal components, the quantity being formed from the orthogonal components and the transformation elements.

The space vector lies completely in the real axis if:

$$Im(g_s) = -g_\alpha \sin \omega t + g_\beta \cos \omega t = 0$$

Thus, the direction of the space vector in the image space associated with this transformation is fixed. The controlled variable is now formed by a controller, to which the imaginary component of the space vector is provided as the actual value, and the value zero as the desired value. Therefore, the frequency on which the transformation is based is readjusted in such a manner that the space vector always points in the direction of the imaginary axis.

The frequency $\omega$ which is proportional to the controlled quantity is precisely the speed of rotation of the in-phase component of the transmission system. In this manner, the desired low-noise angular frequency of the electromechanical system is determined. Consequently, only the frequency-proportional controlled quantity remains to be measured at the controller output as the measurement variable for the frequency of the transmission system. Its derivative with respect to time is the angular acceleration of the in-phase system; this value being negative in the case of a power deficit, and positive in the case of excess power. The frequency is advantageously divided into a predetermined constant portion $\omega_N$, corresponding to the nominal frequency of the network, and a variable portion $\delta$. Only the variable portion is determined by the control. The time integral thereof, corresponding to $\int \delta\, dt$ indicates the phase difference between the transmission system and the supply network.

In addition to the foregoing, the imaginary component, or some other quantity which determines the direction of the space vector in the image space of the transformation, can also be selected instead of the real component of the space vector. It is assured that the time-averaged space vector always points in the same direction by setting a suitable constant desired value.

BRIEF DESCRIPTION OF THE DRAWINGS

Comprehension of the invention is facilitated by reading the following detailed description in conjunction with the annexed drawings, in which.

DETAILED DESCRIPTION

Figure 1:
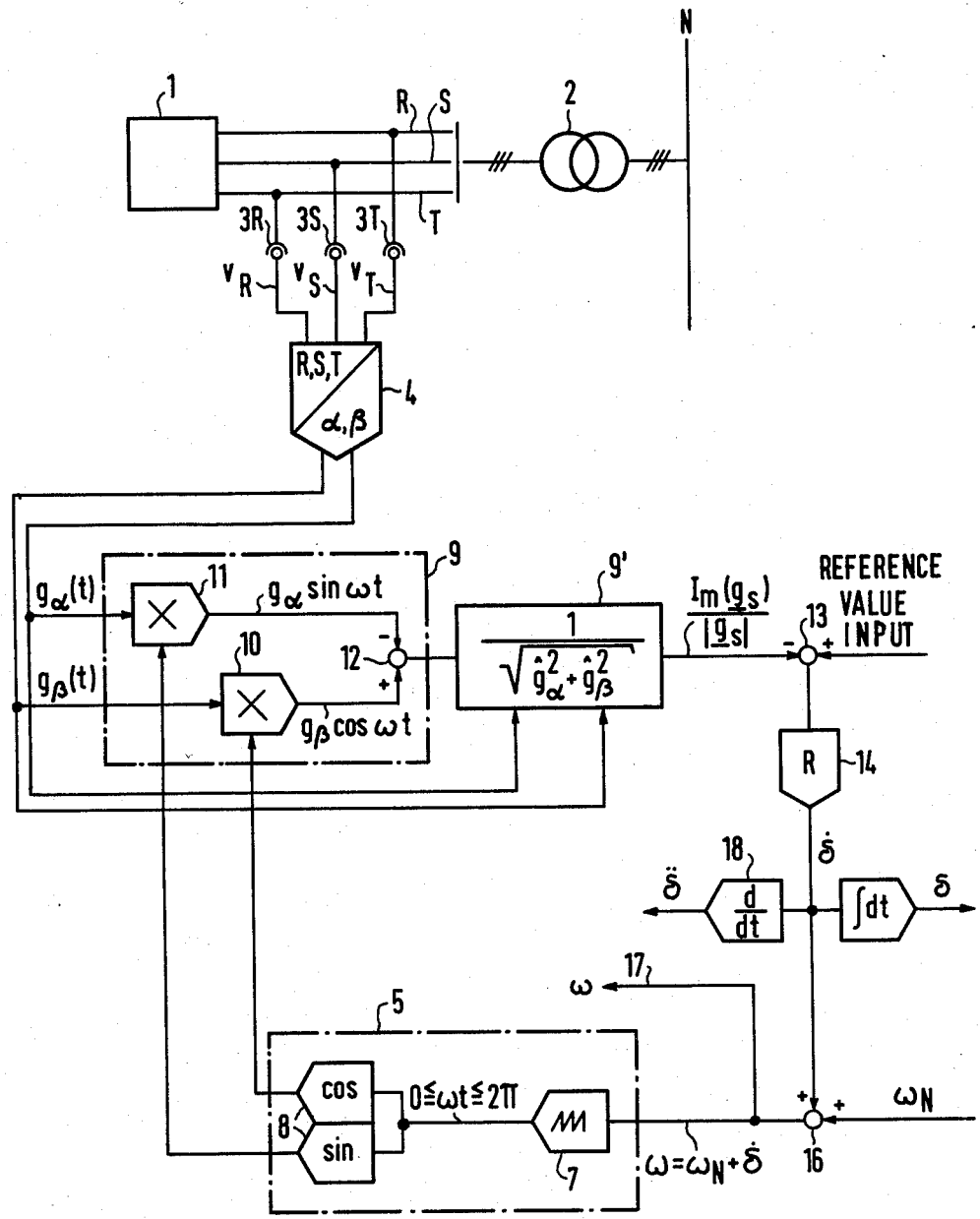
FIG. 1 is a schematic and function block representation of a system constructed in accordance with the principles of the invention.

FIG. 1 shows a power generator or consumer 1 which is connected via respective conductors R, S, and T of a three-phase line system, and a coupling unit 2, to a supply network N. A plurality of voltage measuring transformers 3R, 3S, and 3T provide respective measured values of conductor-to-ground voltages, $v_R$, $v_S$, and $v_T$ which are supplied to a 3/2 coordinate transformer 4. This arrangement therefore provides, essentially without time delay, the stationary orthogonal components $g_\alpha(t)$ and $g_\beta(t)$ of a neutral-point-less system associated with transmission system R, S, and T.

A control element 5 containing a integrating function generator furnishes the transformation elements for a transformation of the stationary orthogonal components. In one embodiment, the control element contains a frequency-controlled sawtooth generator 7 which functions as an integrator for the supplied controlled variable ω, the integrator being connected at its output to a function generator 8 which forms cos ωt and sin ωt. The outputs of the function generator therefore represent the transformation elements with respect to the controlled-quantity-proportional frequency ω.

A transformation circuit 9 supplies a direction-determining magnitude of the space vector from the transformation elements and the orthogonal components. Transformation circuit 9 is of simple design and is provided with two multipliers 10 and 11, by which respective orthogonal components are linked to respective transformation elements. In this embodiment, only the imaginary component of the space vector is formed as the direction-determining quantity and is compared as an actual value at a control comparator 13 with the corresponding reference value zero for the direction of the space vector. In a particularly advantageous embodiment of the invention, transformation circuit 9 is coupled to a normalizing circuit 9' which normalizes the magnitude of the space vector, which, in a general case, is a constant value corresponding to $$\sqrt{\hat{g}_\alpha^2 + \hat{g}_\beta^2} \ .$$

The output of normalizing circuit 9' therefore represents the quantity $Im(g_s)/|g_s|$, such that constant control gain can be achieved for the control comparison by this actual-value input.

Normalizing circuit 9' is coupled at its output to an input of a control comparator 13 which is provided with a further input for receiving a reference value. Control comparator 13 is coupled at its output to a controller 14 which receives a signal corresponding to the difference between the actual and reference values. Controller 14 provides at its output the input variable ("controlled quantity") which is conducted to control element 5. In a particularly advantageous embodiment of the invention, a superposition point 16 is provided to superimpose upon the input variable the nominal value of the network frequency, and therefore the controller needs to compensate only for deviations from the nominal frequency.

The controlled quantity ω, which is the measured frequency value, is available at line 17 and may advantageously be used to form the derivative with respect to time of the controller output signal. Also, a differentiator 18 is utilized to provide a signal corresponding to the acceleration of the in-phase system. Thus, the frequency and acceleration of the system, or a measured value for the magnitude of the in-phase component, may be utilized to form a mixed quantity characteristic of the power balance of the electrical transmission system.

The controller may advantageously be provided with an integrating component which compensates completely for the directional deviation of the space vector. In the steady-state condition, the controller compensates the average direction deviation of the space vector and thereby averages out harmonics. The dynamic behavior of the contoller need not be matched specifically to the network frequency, but can be adapted to the requirements of each case by a suitable intervention into its external wiring with respect to its dynamic behavior. The integrating portion of the controller can be set to have higher or lower effects upon the signals, depending upon whether the measuring situation calls for high accuracy or a short transient time.

Figure 2:
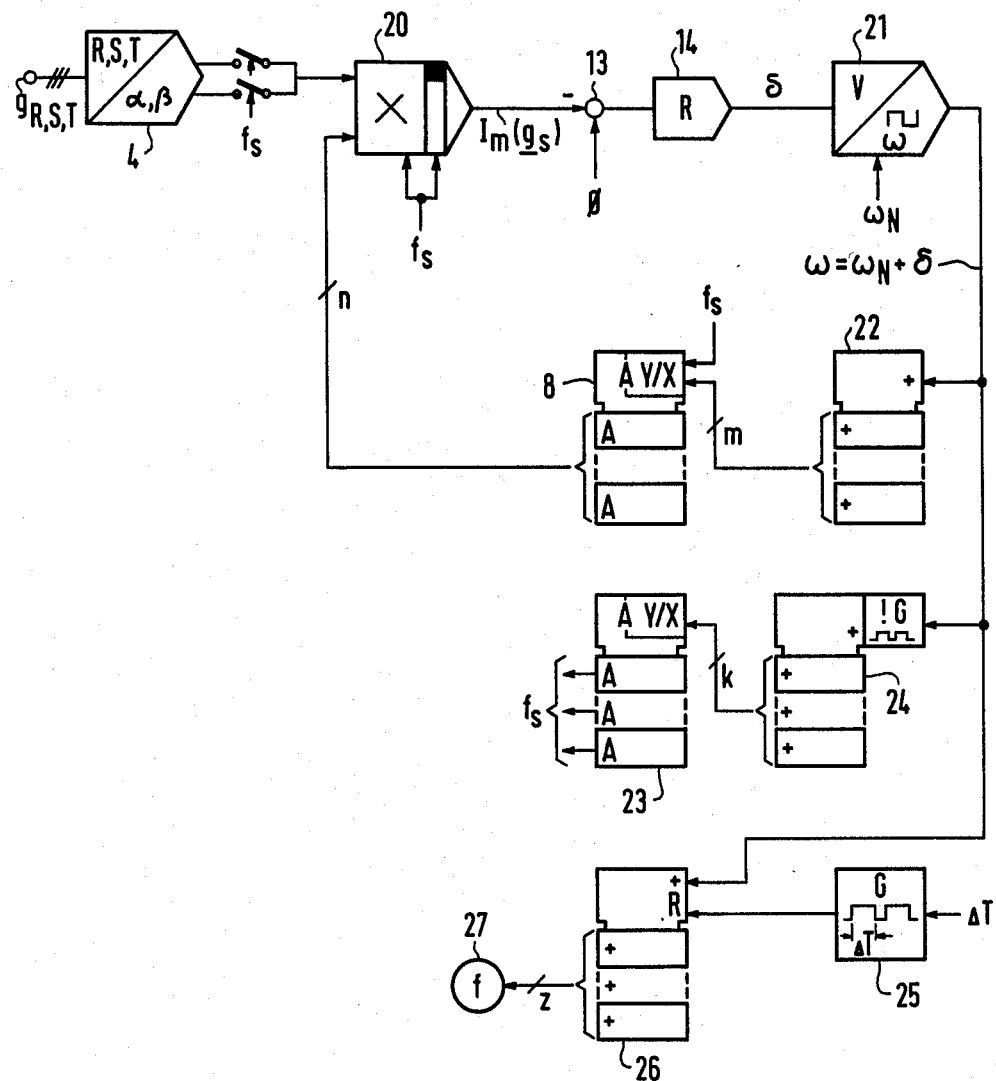
FIG. 2 is a function block representation of a digital system constructed in accordance with the invention.

FIG. 2 is a function block representation of an embodiment of the invention which utilizes digital signals. Elements of structure which have analogous correspondence to FIG. 1 are designated accordingly. Coordinate transformer 4 provides the orthogonal components in the form of analog voltages to an analog input of a sampling multiplier 20 which operates in the multiplex mode. Multiplexer 20 operates as a transformation circuit and forms the imaginary component, and in some embodiment, also functions as a normalizing circuit. The reference value zero is set into control comparator 13. Control comparator 13 is connected at its output to an input of controller 14 which addresses a voltage-controlled oscillator 21. The input quantity of voltage-controlled oscillator 21 is increased further by a predetermined fixed value of the nominal frequency $\omega_N$. The output of voltage-controlled oscillator 21 corresponds to a frequency-proportional pulse sequence $\omega = \omega_N + \delta$, which is conducted to an integrating-action counter for generating a sawtooth voltage. The m-bit output word of counter 22, which corresponds to a division of a period into $2^m$ time steps, addresses a read-only memory (ROM) 8. ROM 8 provides a n-bit output word which represents sin ωt and cos ωt, and is connected to the digital input of sampling multiplier 20.

The switching signals of the operating frequency $f_s$ required for controlling the muliplex and sampling operations are taken from a further ROM 23 which addresses a $2^k$ stage. Such switching signals synchronously start a counter 24 which counts the output pulses of oscillator 21. During frequency measurement, pulses having a duration ΔT are generated in a pulse generator 25. The pulses of oscillator 21 occurring during the period ΔT are added in a counter 26. An indicator 27 is provided for indicating the content of counter 26.

The inventive system can be utilized for any multiphase quantity, illustratively for voltages, currents, fluxes, and charges. Moreover, the arrangement is not limited in its use to three-phase systems, but may be expanded to operate in conjunction with AC systems having more than three phases. It should further be noted that not all portions of the systems described hereinabove are needed for each application. For example, in situations where an in-phase system has an approximately constant value, normalization of the space vector may not be needed. On the other hand, for a three-phase frequency measuring system, wherein the load is to be shed in case of a power deficit, the magnitude of the in-phase voltage can be added as an interference quantity at adder 16.

In addition to the foregoing, the invention can be expanded to measure the torque exerted by a three-phase motor. In such a system, the instantaneous value of the motor terminal power is formed by known multiplier circuits and this value is corrected by the simulated winding and iron losses of the stator. A measurement value for the instantaneous torque is obtained by dividing the terminal power value with the angular frequency of the rotating field, which is obtained as described hereinabove.

Although the invention has been described in terms of specific embodiments and applications, persons skilled in the art, in light of this teaching, can generate additional embodiments without exceeding the scope or departing from the spirit of the claimed invention. Accordingly, it is to be understood that the drawings and descriptions in this disclosure are proffered to facilitate comprehension of the invention and should not be construed to limit the scope thereof.

What is claimed is:

1. A method for measuring frequency in a multiphase line system for the transmission of electrical power, the method comprising the steps of:
    producing measurement values corresponding to electrical quantities on the multiphase line system;
    forming orthogonal components of a neutral-point-less measurement value system;
    forming two variable elements of a transformation matrix from a control variable, said variable element having a frequency proportional to said control variable;
    forming a direction-determining quantity of a space vector from said orthogonal components and said variable elements of said transformation matrix; and
    presetting a desired value for said direction-determining quantity of said space vector, said control variable being controlled in such a manner that said space vector has a constant direction, said control variable corresponding to a measured frequency value.

2. The method of claim 1 wherein there are provided the further steps of:
    selecting one of a real and an imaginary component of said space vector as said direction-determining magnitude thereof; and
    presetting said desired value for said direction-determining magnitude of said space vector to a zero value.

3. An arrangement for measuring frequency in a multiphase line system, the arrangement comprising:
    measurement means coupled to the line system for providing, essentially without delay, stationary orthogonal components of a neutral-point-less system associated with the line system;
    control means having an integrating function generator for providing transformation elements;
    transformation means responsive to said transformation elements of said control means and said stationary orthogonal components for transforming said stationary orthogonal components into an associated space vector with respect to an image space associated with a frequency proportional to said control variable, said transformation means determining a magnitude of said space vector from said transformation elements and said stationary orthogonal components;
    controller means responsive to said direction-determining magnitude and a constant reference value, for forming said control variable; and
    output means for providing said control variable as a value corresponding to the frequency measurement.

4. The arrangement of claim 3 wherein there is further provided normalizing circuit means connected to said transformation circuit for normalizing a magnitude of said space vector.

5. The arrangement of claim 3 wherein said control means is provided with an integrator.

6. The arrangement of claim 5 wherein there is further provided adjustment means in said control means for adjusting a dynamic characteristic of said control means.

7. The arrangement of claim 3 wherein there is further provided differentiator means connected to said output means.

8. The arrangement of claim 3 wherein there is formed a mixed variable corresponding to a power balance in the electrical transmission of the line system, said mixed variable being formed from a measured frequency and a selectable one of a change in time of said frequency and a magnitude of an in-phase component.

* * * * *